(12) United States Patent
Huang et al.

(10) Patent No.: US 9,641,130 B2
(45) Date of Patent: May 2, 2017

(54) LOW NOISE AMPLIFIER WITH NOISE AND LINEARITY IMPROVEMENT

(71) Applicant: WIN Semiconductors Corp., Tao Yuan (TW)

(72) Inventors: Fan-Hsiu Huang, New Taipei (TW); Jui-Chieh Chiu, Taoyuan (TW); Chih-Wen Huang, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 14/882,470

(22) Filed: Oct. 14, 2015

(65) Prior Publication Data

US 2016/0344345 A1 Nov. 24, 2016

(30) Foreign Application Priority Data

May 19, 2015 (TW) .............................. 104115849 A

(51) Int. Cl.
| | |
|---|---|
| *H03F 3/16* | (2006.01) |
| *H03F 1/02* | (2006.01) |
| *H03F 1/26* | (2006.01) |
| *H03F 3/193* | (2006.01) |
| *H03F 1/32* | (2006.01) |
| *H03F 1/22* | (2006.01) |

(52) U.S. Cl.
CPC ........... *H03F 1/0205* (2013.01); *H03F 1/223* (2013.01); *H03F 1/26* (2013.01); *H03F 1/32* (2013.01); *H03F 3/193* (2013.01); *H03F 1/22* (2013.01); *H03F 3/16* (2013.01); *H03F 2200/294* (2013.01); *H03F 2200/451* (2013.01)

(58) Field of Classification Search
CPC . H03F 1/0205; H03F 1/26; H03F 3/19; H03F 3/193; H03F 3/21
USPC .................. 330/277, 285, 296, 300, 311
See application file for complete search history.

(56) References Cited

U.S. PATENT DOCUMENTS

| | | | | |
|---|---|---|---|---|
| 6,768,377 | B2* | 7/2004 | Macedo | H03F 1/302 330/151 |
| 6,882,226 | B2* | 4/2005 | Cho | H03F 1/342 330/278 |
| 6,933,779 | B2 | 8/2005 | Lee | |
| 7,619,482 | B1 | 11/2009 | Kobayashi | |
| 7,629,850 | B2* | 12/2009 | Floyd | G06F 17/5063 330/284 |
| 7,714,657 | B2* | 5/2010 | Wu | H03F 1/0261 330/284 |
| 8,319,555 | B1* | 11/2012 | Heikkinen | H03F 1/565 330/283 |
| 8,648,656 | B2* | 2/2014 | Nozaki | H03F 1/0261 330/298 |

(Continued)

*Primary Examiner* — Khanh V Nguyen
(74) *Attorney, Agent, or Firm* — Winston Hsu; Scott Margo

(57) ABSTRACT

A low noise amplifier (LNA) has been disclosed for the noise and linearity performance improvement. The LNA includes an amplifying transistor and an auxiliary transistor. The amplifying transistor includes a first terminal for receiving an input signal of the LNA, a second terminal for outputting an output signal of the LNA, and a third terminal. The auxiliary transistor has a first terminal, a second terminal coupled to the second terminal of the amplifying transistor, and a third terminal electrically connected to the first terminal of the amplifying transistor.

12 Claims, 6 Drawing Sheets

(56) References Cited

U.S. PATENT DOCUMENTS

2007/0063767 A1\* 3/2007 Das ........................ H03F 1/14
330/51

\* cited by examiner

LOW NOISE AMPLIFIER WITH NOISE AND LINEARITY IMPROVEMENT

BACKGROUND OF THE INVENTION

1. Field of the Invention

The present invention relates to a low noise amplifier, and more particularly, to a low noise amplifier with low circuit complexity, low noise figure, and high linearity.

2. Description of the Prior Art

As technology evolves, wireless communication is an important part of human life. Various electronic devices, such as smart phones, smart wearable devices, tablets, etc., utilize wireless radio frequency (RF) systems to transmit and receive wireless signals. A low noise amplifier (LNA) is a necessary amplifier in a receiver of the wireless RF system. Performance of the LNA affects performance of the overall wireless RF system. Moreover, signal linearity and noise figure are key performance metrics of the LNA.

In the prior art, LNA circuits using cascoded circuit topology, active bias network, parallel type transconductance compensation, and envelope tracking are provided to improve the signal linearity thereof. The cascoded circuit topology has the advantages of high frequency gain and noise figure improvement. However, using cascoded circuit topology relies on a high voltage supply, such that each transistor would have low noise and high power saturation properties, which could suffer inconvenience in LNA design. In addition, using an active bias network to LNA may have high frequency gain, and automatically adjust bias according to an operating output power of the LNA. However, the LNA using an active bias skill has more circuit complexity and suffers higher direct current (DC) power consumption. Furthermore, such skill is sensitive to device characteristic variation due to semiconductor manufacturing processes, causing inconvenience in designing and manufacturing. In addition, the parallel type transconductance compensation may adjust the bias condition and generate a mixed output signal through two transistors connected in parallel, so as to achieve a compensation on third-order intermodulation (IMD3), which improves an overall signal linearity of the LNA. However, capacitance at both the input and output ports of the LNA would be increased, which could influence the high frequency performance, i.e., high frequency impedance matching or high frequency signal gain. In addition, the envelope tracking architecture provides a dynamic bias control under different operating powers via feedback sensing network and digital controller, which improves the DC and RF power efficiencies. However, using envelope tracking requires more active and inactive components such as analog and digital control circuits, which could increase the circuit complexity and production cost of the LNA circuit.

On the other hand, in the prior art, LNA circuits using cascoded circuit topology, active feedforward topology, and input active load are provided to improve the noise figure thereof. Theoretically, the LNA using cascoded circuit topology itself has good noise figure performance. However, a biasing network at input port with using a feed-in inductance or a feed-in resistance to provide voltage or current brings a degraded noise figure performance, because the equivalent thermal resistance induces an additional thermal noise. In addition, although the active feedforward topology has an improvement in the noise figure, nevertheless, complicated circuit design with more DC biases is required to compensate the internal noise of the LNA, which is meaning that DC power consumption will be presented. Using input active load to LNA circuit has the advantages of wideband noise impedance matching and lower power operations. The LNA may be applied to wideband wireless system by properly adjusting bias of transistors and by choosing sizes of the transistors. However, the linearity performance is needed to be taken into account due to the large-signal characteristic and behavior of the input active load circuit.

Therefore, how to provide a low noise amplifier with low circuit complexity, low noise figure and high signal linearity is a significant objective in the field.

SUMMARY OF THE INVENTION

It is therefore a primary objective of the present invention to provide a low noise amplifier with low circuit complexity, low noise figure and high linearity.

The present invention discloses a low noise amplifier (LNA). The LNA comprises an amplifying transistor and an auxiliary transistor. The amplifying transistor comprises a first terminal configured to receive an input signal of the LNA, a second terminal configured to deliver an output signal of the LNA, and a third terminal. The auxiliary transistor comprises a first terminal, a second terminal coupled to the second terminal of the amplifying transistor, and a third terminal electrically connected to the first terminal of the amplifying transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
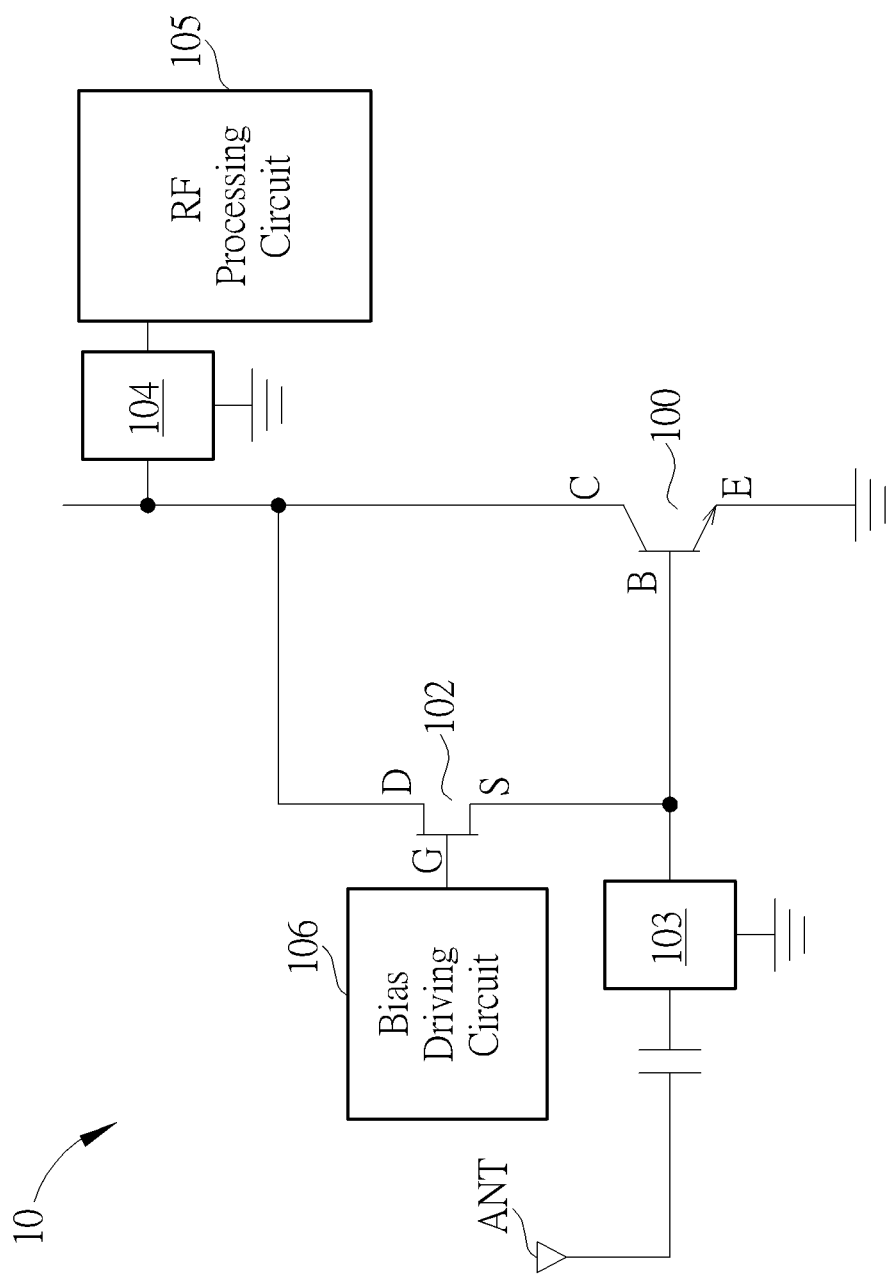
FIG. 1 is a schematic diagram of a low noise amplifier according to an embodiment of the present invention.

FIG. 1 is a schematic diagram of a low noise amplifier 10 according to an embodiment of the present invention. The low noise amplifier 10 comprises an amplifying transistor 100 and an auxiliary transistor 102. The amplifying transistor 100 may be a bipolar junction transistor (BJT) or a heterojunction bipolar transistor (HBT). The auxiliary transistor 102 may be a metal-oxide-semiconductor field effect transistor (MOSFET) or a high electron mobility transistor (HEMT). The amplifying transistor 100 comprises a base B (first terminal), a collector C (second terminal) and an emitter E (third terminal). The base B is coupled to an antenna ANT. The base B may be coupled to the antenna ANT through an input network 103, wherein the input network 103 may comprise an impedance matching network or a band pass filter (not illustrated in FIG. 1). The base B is utilized to receive an input signal of the low noise amplifier 10. The collector C is coupled to a radio frequency processing circuit 105 through an output network 104. The input network 104 may comprise an impedance matching network or a gain amplifier. The output network 104 is used to maintain a good impedance matching between the low noise amplifier 10 and the radio frequency processing circuit 105. The collector C is utilized to deliver an output signal of the low noise amplifier 10 to the radio frequency processing circuit 105. The emitter E may be coupled to a system ground. The auxiliary transistor 102 comprises a gate G (first terminal), a drain D (second terminal) and a source S (third terminal). The drain D is coupled to the collector C of the amplifying transistor 100. The source S is electrically connected to the base B of the amplifying transistor 100. The gate G may be coupled to a bias driving circuit 106, wherein the bias driving circuit 106 may be a fixed biasing circuit or a digital controllable and adjustable biasing circuit.

Note that, the auxiliary transistor 102 is combined between the input terminal (the base B) and the output terminal (the collector C) of the amplifying transistor 100. The bias condition of the low noise amplifier 10 may be adjusted by auxiliary transistor 102 to the input terminal of the amplifying transistor 100 according to an output amplitude level at the output terminal of the amplifying transistor 100. The signal linearity therefore is improved due to the bias adjustable function. Meanwhile, noise figure of the amplifying transistor 100 may be counteracted by using the auxiliary transistor 102, resulting in an improved overall noise figure in the low noise amplifier 10. In other words, the low noise amplifier 10 only utilizes the single auxiliary transistor 102 to adjust the bias at the input terminal of the amplifying transistor 100 and counteract the noise of the amplifying transistor 100, so as to improve the signal linearity and the noise figure of the low noise amplifier 10. In addition, the low noise amplifier 10 has low circuit complexity.

Figure 2:
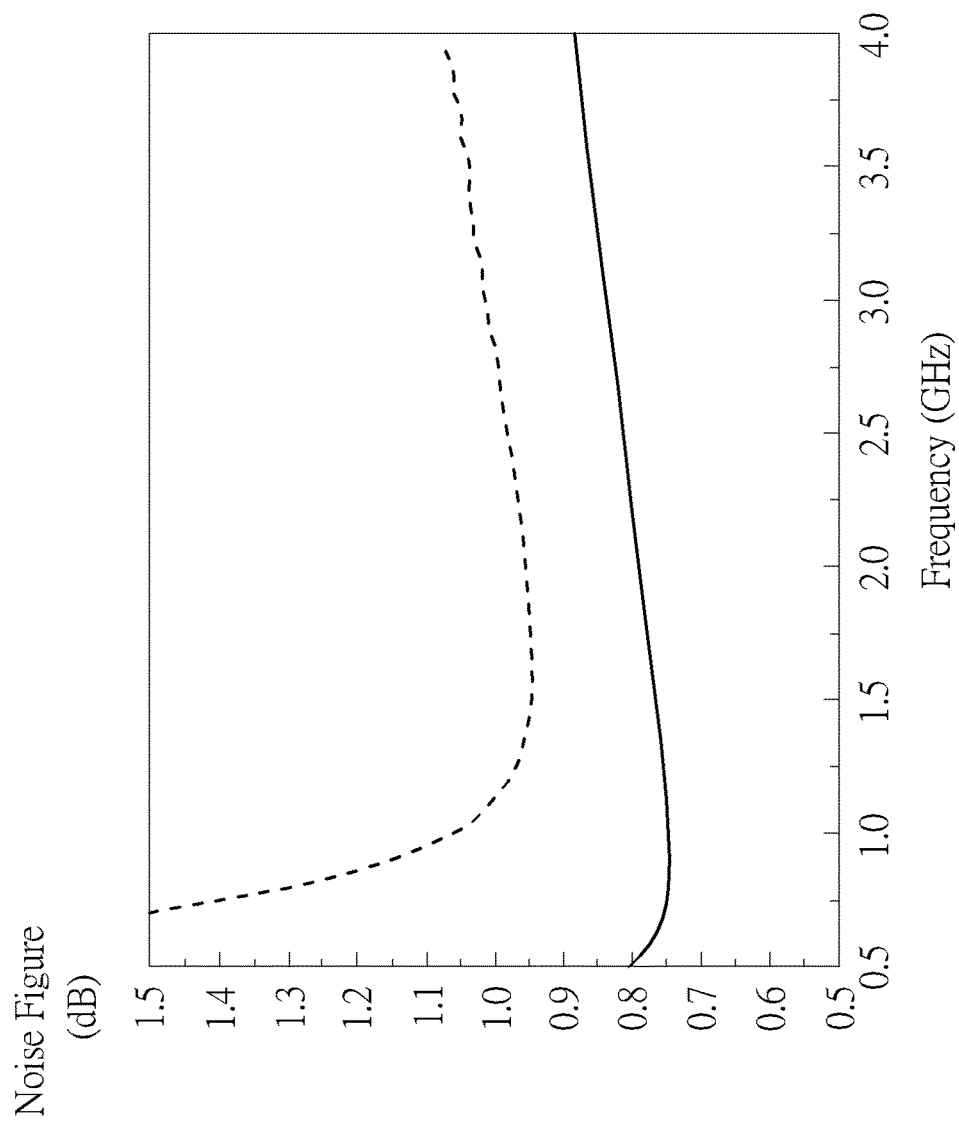
FIG. 2 is a noise figure performance comparison of low noise amplifiers with an auxiliary transistor and without the auxiliary transistor.
Figure 3:
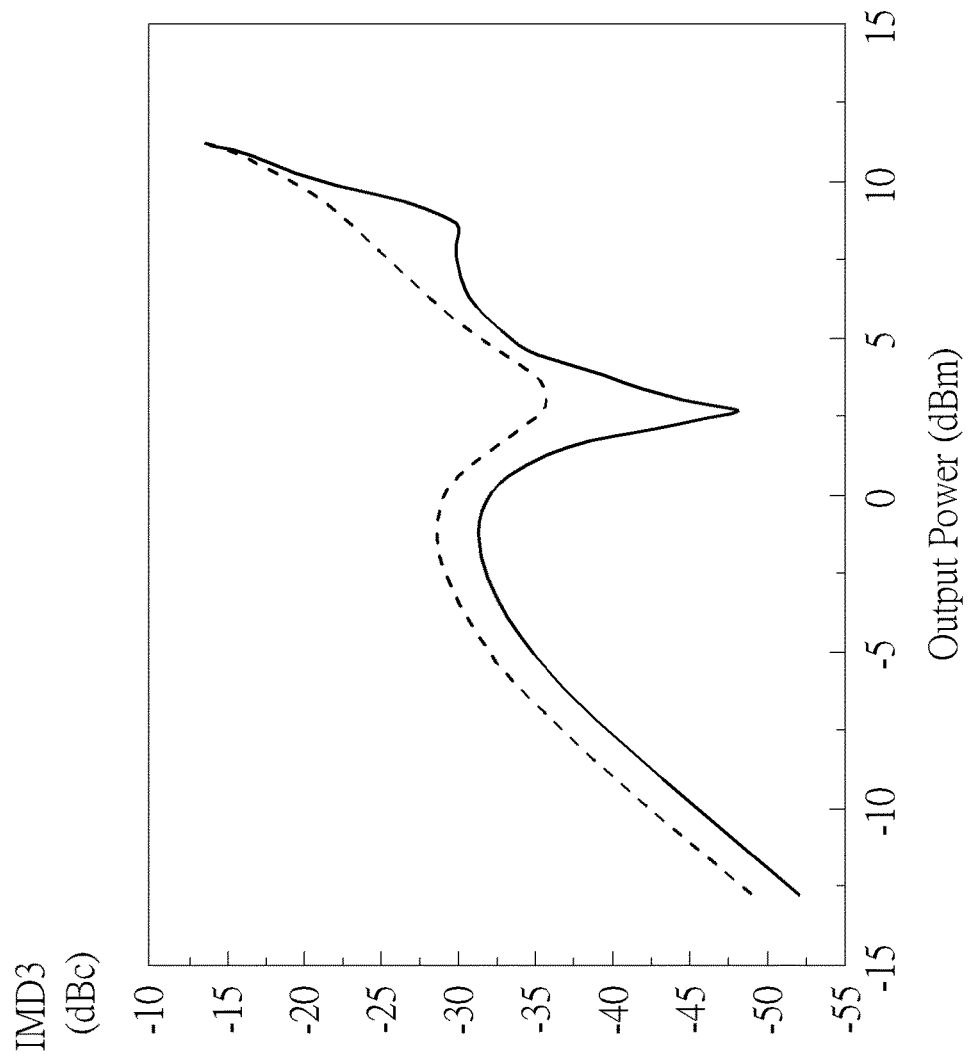
FIG. 3 is IMD3 performance comparison of the low noise amplifiers with the auxiliary transistor and without the auxiliary transistor.

FIGS. 2 and 3 are the comparisons of noise figure and linearity performance (i.e., third-order intermodulation (IMD3)) of low noise amplifiers with and without the auxiliary transistor, respectively, wherein the solid line represents the noise figure and the IMD3 performance of the low noise amplifier comprising the auxiliary transistor, and the dashed line represents the noise figure and the IMD3 performance of the low noise amplifier without the auxiliary transistor. As can be seen from FIGS. 2 and 3, the low noise amplifier comprising the auxiliary transistor has a better performance in terms of the noise figure and signal linearity.

In addition, please refer to TABLE I. TABLE I lists the small signal gain, the noise figure, the 1 dB compression point (P1dB), and the linearity (IMD3) when the output power is 8 dBm of the low noise amplifiers with and without the auxiliary transistor. As can be seen from TABLE I, the low noise amplifier with the auxiliary transistor improves the performances both in the noise figure and IMD3, and only has a slightly small signal gain decrease without increasing the direct current (DC) power consumption.

TABLE I

|  | LNA without the auxiliary transistor | LNA with the auxiliary transistor |
| --- | --- | --- |
| Small signal gain (dB) | 21.1 | 20.5 |
| Noise figure (dB) | 0.983 | 0.809 |
| P1dB (dBm) | 10.1 | 13.3 |
| IMD3 (dBc) | −24.6 | −29.8 |

Figure 4:
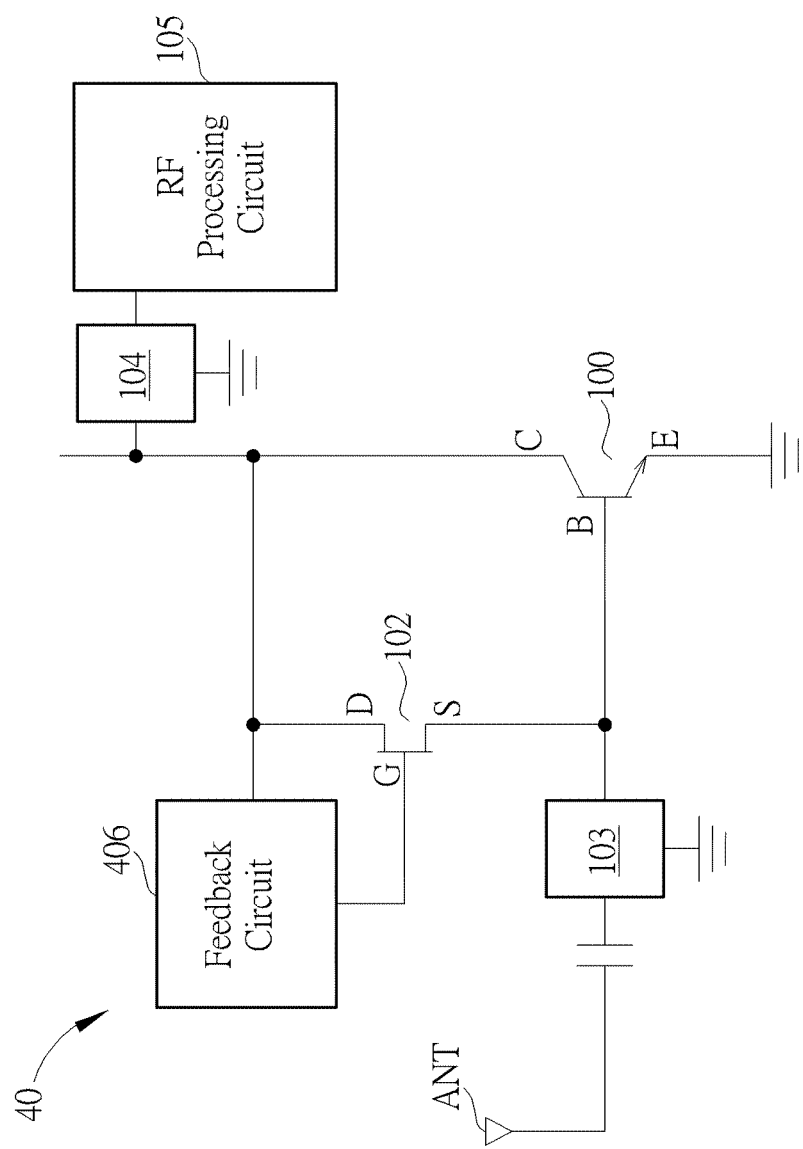
FIG. 4 is a schematic diagram of a low noise amplifier according to an embodiment of the present invention.

Notably, the embodiments stated in the above are utilized for illustrating concepts of the present invention. Those skilled in the art may make modifications and alternations accordingly, and not limited herein. For example, please refer to FIG. 4, which is a schematic diagram of a low noise amplifier 40 according to an embodiment of the present invention. The low noise amplifier 40 is similar to the low noise amplifier 10, and thus, the same symbols are denoted by the same notations. Different from the low noise amplifier 10, the low noise amplifier 40 is coupled to a feedback circuit 406, the feedback circuit 406 is coupled between the gate and the drain of the auxiliary transistor 102, which satisfies requirements of the present invention, and not limited herein. In addition, the amplifying transistor is not limited to be a BJT or an HBT. The amplifying transistor may also be a field effect transistor (FET) such as a MOSFET or an HEMT. In such a situation, the first terminal of the amplifying transistor is a gate of the FET, and the second terminal and the third terminal of the amplifying transistor are a drain or a source of the FET. In addition, the auxiliary transistor is not limited to be a MOSFET or a HEMT. The auxiliary transistor may also be a BJT or an HBT. In such a situation, the first terminal of the auxiliary transistor is a base of the BJT/HEMT, and the second terminal and the third terminal of the auxiliary transistor is a collector and an emitter of the BJT/HEMT.

Figure 5:
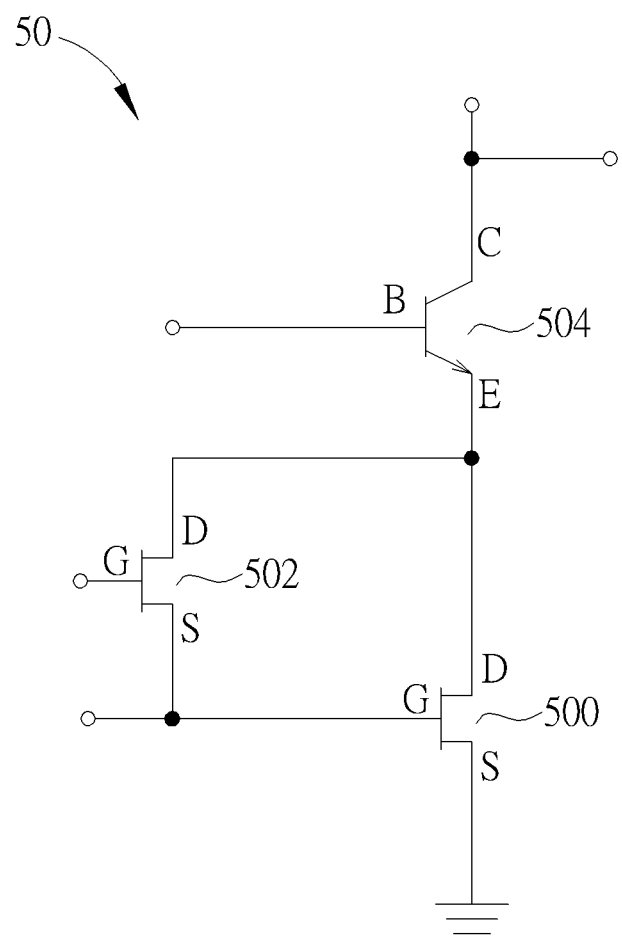
FIG. 5 is a schematic diagram of a low noise amplifier according to an embodiment of the present invention.
Figure 6:
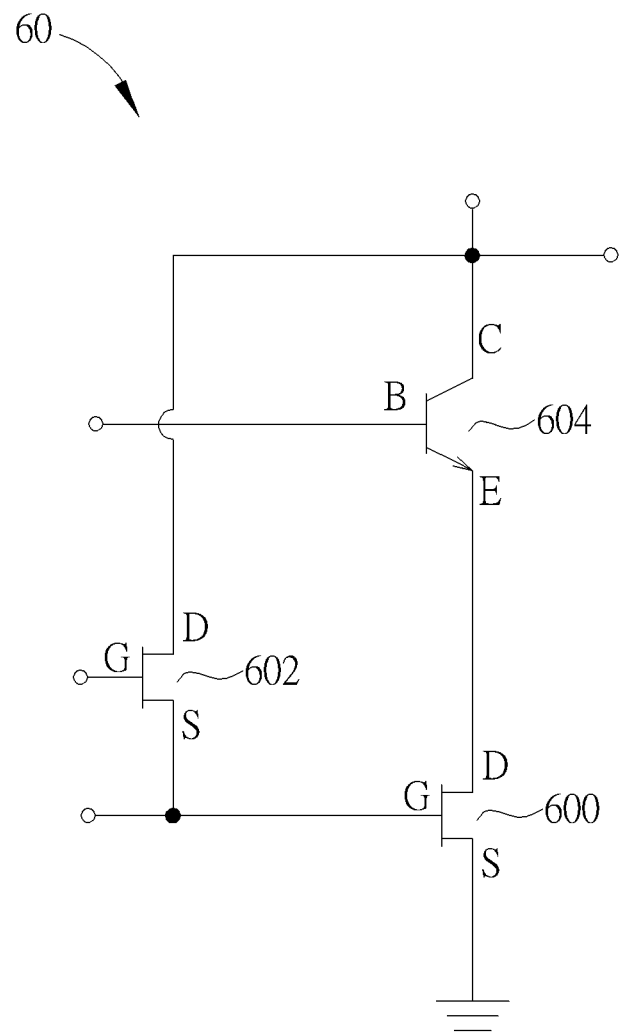
FIG. 6 is a schematic diagram of a low noise amplifier according to an embodiment of the present invention.

In addition, the LNA of the present invention may also be applied to form a cascoded LNA. For example, please refer to FIG. 5 and FIG. 6, which are schematic diagrams of a LNA 50 and a LNA 60. The LNA 50 comprises an amplifying transistor 500, an auxiliary transistor 502 and a cascoded transistor 504, and the LNA 60 comprises an amplifying transistor 600, an auxiliary transistor 602 and a cascoded transistor 604. In the current embodiments, the amplifying transistors 500, 600 and the auxiliary transistors 502, 602 are HEMTs (or MOSFETs), and the cascoded transistors 504, 604 are HBTs (or BJTs). In the LNA 50, a source S (third terminal) of the auxiliary transistor 502 is coupled to a gate G (first terminal) of the amplifying transistor 500. A drain G (second terminal) of the auxiliary transistor 502 is coupled to a drain D (second terminal) of the amplifying transistor 500. In addition, an emitter E (first terminal) of the cascoded transistor 504 is coupled to the drain D of the auxiliary transistor 502 and the drain D of the amplifying transistor 500, and a collector C (second terminal) of the cascoded transistor 504 is configured to deliver an output signal. Similarly, in the LNA 60, a source S (third terminal) of the auxiliary transistor 602 is coupled to a gate G (first terminal) of the amplifying transistor 600. Different from the LNA 50, the cascoded transistor 604 is coupled between a drain D (second terminal) of the auxiliary transistor 602 and a drain D (second terminal) of the amplifying transistor 600. Specifically, an emitter E (first terminal) of the cascoded transistor 604 is coupled to a drain D (second terminal) of the amplifying transistor 600, and a collector C (second terminal) of the cascoded transistor 604 is coupled to a drain D (second terminal) of the auxiliary transistor 602.

In summary, the low noise amplifier of the present invention only utilizes the single auxiliary transistor to adjust the bias at the input terminal of the amplifying transistor and counteract the noise characteristic of the amplifying transistor, so as to improve the signal linearity and the noise figure. In addition, the low noise amplifier of the present invention has low circuit complexity.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A low noise amplifier (LNA), comprising:
    an amplifying transistor being a bipolar junction transistor (BJT), comprising:
        a first terminal being a base of the BJT, configured to receive an input signal of the LNA;
        a second terminal; and
        a third terminal; and
    an auxiliary transistor being a field effect transistor (FET), comprising:
        a first terminal being a gate of the FET;
        a second terminal, configured to output an output signal of the LNA, coupled to the second terminal of the amplifying transistor; and
        a third terminal, electrically connected to the first terminal of the amplifying transistor;
    wherein the first terminal of the auxiliary transistor is coupled to a terminal of a feedback circuit, and another terminal of the feedback circuit is coupled to the second terminal of the amplifying transistor.

2. The LNA of claim 1, wherein the first terminal of the amplifying transistor is coupled to an antenna for receiving the input signal of the LNA, and the second terminal of the amplifying transistor is coupled to a radio frequency processing circuit.

3. The LNA of claim 1, wherein the third terminal of the amplifying transistor is coupled to a system ground.

4. The LNA of claim 1, wherein the first terminal of the auxiliary transistor is coupled to a driving circuit.

5. The LNA of claim 1, wherein the second terminal and the third terminal of the amplifying transistor are a collector and an emitter of the BJT.

6. The LNA of claim 5, wherein the amplifying transistor is a heterojunction bipolar transistor (HBT).

7. The LNA of claim 1, wherein the second terminal and the third terminal of the auxiliary transistor are a drain or a source of the FET.

8. The LNA of claim 7, wherein the auxiliary transistor is a high electron mobility transistor.

9. The LNA of claim 1, wherein a cascoded transistor is coupled to the second terminal of the amplifying transistor and the second terminal of the auxiliary transistor.

10. The LNA of claim 9, wherein a first terminal of the cascoded transistor is coupled to the second terminal of the amplifying transistor and the second terminal of the auxiliary transistor, and a second terminal of the cascoded transistor is configured to output an output signal.

11. The LNA of claim 1, wherein a cascoded transistor is coupled between the second terminal of the amplifying transistor and the second terminal of the auxiliary transistor.

12. The LNA of claim 11, wherein a first terminal of the cascoded transistor is coupled to the second terminal of the amplifying transistor, a second terminal of the cascoded transistor is coupled to the second terminal of the auxiliary transistor, and the second terminal of the cascoded transistor is configured to output an output signal.

* * * * *